United States Patent
Sudol et al.

(10) Patent No.: US 10,898,924 B2
(45) Date of Patent: Jan. 26, 2021

(54) TILED CMUT DIES WITH PITCH UNIFORMITY

(71) Applicant: KONINKLIJKE PHILIPS N.V., Eindhoven (NL)

(72) Inventors: Wojtek Sudol, Eindhoven (NL); Peter Dirksen, Eindhoven (NL); Vincent Adrianus Henneken, Eindhoven (NL); Ronald Dekker, Eindhoven (NL); Marcus Cornelis Louwerse, Eindhoven (NL)

(73) Assignee: Koninklijke Philips N.V., Eindhoven (NL)

( * ) Notice: Subject to any disclaimer, the term of this patent is extended or adjusted under 35 U.S.C. 154(b) by 642 days.

(21) Appl. No.: 15/325,492

(22) PCT Filed: Jul. 13, 2015

(86) PCT No.: PCT/EP2015/065943
§ 371 (c)(1),
(2) Date: Jan. 11, 2017

(87) PCT Pub. No.: WO2016/008833
PCT Pub. Date: Jan. 21, 2016

(65) Prior Publication Data
US 2017/0165715 A1    Jun. 15, 2017

Related U.S. Application Data

(60) Provisional application No. 62/025,145, filed on Jul. 16, 2014.

(30) Foreign Application Priority Data

Jul. 31, 2014  (EP) .................................... 14179370

(51) Int. Cl.
*B06B 1/02* (2006.01)
*B81C 1/00* (2006.01)
(Continued)

(52) U.S. Cl.
CPC ........ *B06B 1/0292* (2013.01); *B81C 1/00214* (2013.01); *G01N 29/2406* (2013.01);
(Continued)

(58) Field of Classification Search
CPC ... H04R 19/00; B81C 1/00214; B06B 1/0292; G01N 29/2406; G01N 29/262
(Continued)

(56) References Cited

U.S. PATENT DOCUMENTS 6,283,919 B1   9/2001   Roundhill et al.
6,443,896 B1   9/2002   Detmer
(Continued)

FOREIGN PATENT DOCUMENTS

WO    2009096576 A2    8/2009

OTHER PUBLICATIONS

Yiying Yao, "Thermal Stability of Al2O3/Silicone Composites as High-Temperature Encapsulants" (2014), Virginia Polytechnic and State University, p. 3.*

*Primary Examiner* — John K Kim
*Assistant Examiner* — Minki Chang (57) ABSTRACT

A large aperture CMUT transducer array is formed of a plurality of adjacently located tiles of CMUT cells. The adjacent edges of the tiles are formed by an anisotropic etch process, preferably a deep reactive ion etching process which is capable of cutting through the die and its substrate while maintaining vertical edges in close proximity to the CMUT cells at the edge of the tile. This enables the CMUT cells of continuous rows or columns to exhibit a constant pitch over multiple CMUT cell tiles. The tiles also contain
(Continued)

interconnect electrodes along an edge for making electrical connections to the tiles with flex circuit.

19 Claims, 7 Drawing Sheets

(51) Int. Cl.
*G01N 29/24* (2006.01)
*G01N 29/26* (2006.01)
*H04R 19/00* (2006.01)

(52) U.S. Cl.
CPC .... *G01N 29/262* (2013.01); *B81B 2201/0292* (2013.01); *G01N 2291/02475* (2013.01); *G01N 2291/106* (2013.01); *H04R 19/00* (2013.01)

(58) Field of Classification Search
USPC ........ 310/300, 340, 345, 349; 367/140–188; 381/174
See application file for complete search history.

(56) References Cited

U.S. PATENT DOCUMENTS

| | | | |
|---|---|---|---|
| 6,458,083 B1 | 10/2002 | Jago et al. | |
| 6,530,885 B1 | 3/2003 | Entrekin et al. | |
| 6,865,140 B2 * | 3/2005 | Thomenius | B06B 1/0292 367/155 |
| 7,052,464 B2 * | 5/2006 | Wodnicki | B06B 1/0292 29/25.35 |
| 2004/0174773 A1 * | 9/2004 | Thomenius | B06B 1/0292 367/174 |
| 2004/0190377 A1 | 9/2004 | Kewandowski et al. | |
| 2007/0016020 A1 | 1/2007 | Oshiki et al. | |
| 2008/0042225 A1 | 2/2008 | Machida et al. | |
| 2009/0122651 A1 * | 5/2009 | Kupnik | B06B 1/0292 367/181 |
| 2011/0086443 A1 * | 4/2011 | Kobayashi | B81C 1/00214 438/14 |
| 2011/0170376 A1 * | 7/2011 | Pike | G01P 15/08 367/181 |
| 2012/0133005 A1 | 5/2012 | Langeries et al. | |

\* cited by examiner

TILED CMUT DIES WITH PITCH UNIFORMITY

This application is the U.S. National Phase application under 35 U.S.C. § 371 of International Application No. PCT/EP2015/065943, filed on Jul. 13, 2015, which claims the benefit of U.S. Provisional Application Ser. No. 62/025,145 filed Jul. 16, 2014 and EP Application Serial No. 14179370.3 filed Jul. 31, 2014. These applications are hereby incorporated by reference herein.

FIELD OF THE INVENTION

This invention relates to medical diagnostic ultrasonic imaging and, in particular, to ultrasound probes which use capacitive micromachined ultrasonic transducers (CMUTs).

BACKGROUND OF THE INVENTION

The ultrasonic transducers used for medical imaging have numerous characteristics which lead to the production of high quality diagnostic images. Among these are broad bandwidth and high sensitivity to low level acoustic signals at ultrasonic frequencies. Conventionally the piezoelectric materials which possess these characteristics and thus have been used for ultrasonic transducers have been made of PZT and PVDF materials, with PZT being the most preferred. However the ceramic PZT materials require manufacturing processes including dicing, matching layer bonding, fillers, electroplating and interconnections which are distinctly different and complex and require extensive handling, all of which can result in transducer stack unit yields which are less than desired. Furthermore, this manufacturing complexity increases the cost of the final transducer probe. As ultrasound system mainframes have become smaller and dominated by field programmable gate arrays (FPGAs) and software for much of the signal processing functionality, the cost of system mainframes has dropped with the size of the systems. Ultrasound systems are now available in inexpensive portable, desktop and handheld form. As a result, the cost of the transducer probe is an ever-increasing percentage of the overall cost of the system, an increase which has been accelerated by the advent of higher element-count arrays used for 3D imaging. Accordingly it is desirable to be able to manufacture transducer arrays with improved yields and at lower cost to facilitate the need for low-cost ultrasound systems.

Recent developments have led to the prospect that medical ultrasound transducers can be manufactured by semiconductor processes. Desirably these processes should be the same ones used to produce the circuitry needed by an ultrasound probe such as a CMOS process. These developments have produced micromachined ultrasonic transducers or MUTs. MUTs have been fabricated in two design approaches, one using a semiconductor layer with piezoelectric properties (PMUTs) and another using a diaphragm and substrate with electrode plates that exhibit a capacitive effect (CMUTs). The CMUT transducers are tiny diaphragm-like devices with electrodes that convert the sound vibration of a received ultrasound signal into a modulated capacitance. For transmission the capacitive charge applied to the electrodes is modulated to vibrate the diaphragm of the device and thereby transmit a sound wave. Since these devices are manufactured by semiconductor processes the devices generally have dimensions in the 10-200 micron range, but can range up to device diameters of 300-500 microns. Many such individual CMUTs can be connected together and operated in unison as a single transducer element. For example, four to sixteen individual CMUTs can be coupled together to function in unison as a single transducer element. A typical 2D transducer array currently will have 2000-3000 piezoelectric transducer elements. When fabricated as a CMUT array, over one million CMUT cells will be used. Surprisingly, early results have indicated that the yields on semiconductor fab CMUT arrays of this size should be markedly improved over the yields for PZT arrays of several thousand transducer elements.

Figure 1:
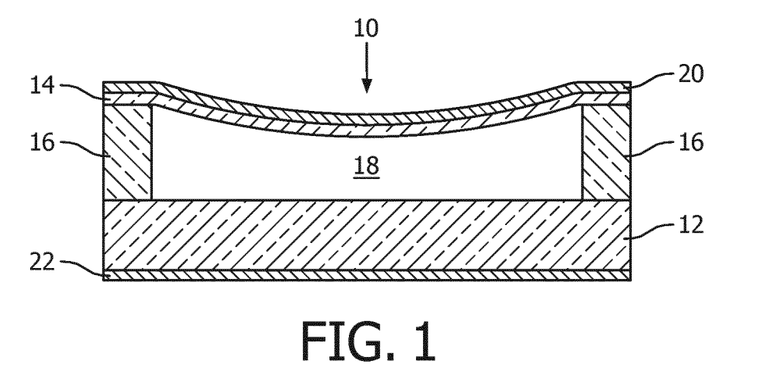
FIG. 1 is a cross-sectional view of a typical CMUT transducer cell.

CMUTs were initially designed to operate in what is now known as an "uncollapsed" mode. Referring to FIG. 1, a typical uncollapsed CMUT transducer cell 10 is shown in cross-section. The CMUT transducer cell 10 is fabricated along with a plurality of similar adjacent cells on a substrate 12 such as silicon. A diaphragm or membrane 14 which may be made of silicon nitride is supported above the substrate by an insulating support 16 which may be made of silicon oxide or silicon nitride. The cavity 18 between the membrane and the substrate may be air or gas-filled or wholly or partially evacuated. A conductive film or layer 20 such as gold forms an electrode on the diaphragm, and a similar film or layer 22 forms an electrode on the substrate. These two electrodes, separated by the dielectric cavity 18, form a capacitance. When an acoustic signal causes the membrane 14 to vibrate the variation in the capacitance can be detected, thereby transducing the acoustic wave into a corresponding electrical signal. Conversely, an a.c. signal applied to the electrodes 20,22 will modulate the capacitance, causing the membrane to move and thereby transmit an acoustic signal.

A CMUT cell is inherently a quadratic device so the acoustic signal is normally the harmonic of the applied signal, that is, the acoustic signal will be at twice the frequency of the applied electrical signal frequency. To prevent this quadratic behavior a bias voltage is applied to the two electrodes which causes the diaphragm to be attracted to the substrate by the resulting coulombic force. This is shown schematically in FIG. 2, where a DC bias voltage $V_B$ is applied to a bias terminal 24 and is coupled to the membrane electrode 20 by a path which poses a high impedance Z to a.c. signals such as an inductive impedance. A.c. signals are capacitively coupled to and from the membrane electrode from a signal terminal 26. The positive charge (+) on the membrane electrode causes the membrane to distend as it is attracted to the negative charge on the substrate 12. The CMUT cell only weakly exhibits the quadratic behavior when operated continuously in this biased state.

Figure 2:
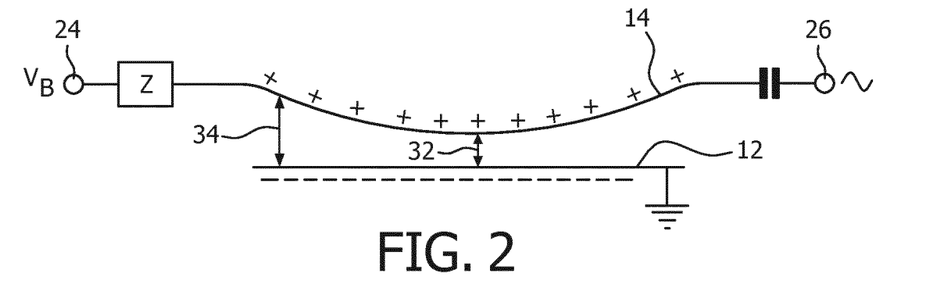
FIG. 2 is a schematic illustration of the electrical properties of a typical CMUT cell.

It has been found that the CMUT is most sensitive when the membrane is distended so that the two oppositely charged plates of the capacitive device are as close together as possible. A close proximity of the two plates will cause a greater coupling between acoustic and electrical signal energy by the CMUT. Thus it is desirable to increase the bias voltage $V_B$ until the dielectric spacing 32 between the membrane 14 and substrate 12 is as small as can be maintained under operating signal conditions. In constructed embodiments this spacing has been on the order of one micron or less. If the applied bias voltage is too great, however, the membrane can contact the substrate, short-circuiting the device as the two plates of the device are stuck together by VanderWals forces. This sticking can occur when the CMUT cell is overdriven, and can vary from one device to another with the same bias voltage $V_B$ due to manufacturing tolerance variations. While permanent sticking can be reduced by embedding the device electrodes in an electrical isolation layer (e.g., silicon nitride), the nonlinearity of operation between collapsed and uncollapsed states is an inherent disadvantage when trying to operate an uncollapsed CMUT in a range of maximal sensitivity.

Even when the membrane is biased to cause a very small sub-micron dielectric spacing, the sensitivity of the CMUT can be less than that which is desired. This is due to the fact that, whereas the charge at the center 32 of the membrane is relatively close to and will move considerably in relation to the opposing charge, the charge at the periphery 34 of the membrane where the membrane is supported by the support 16 will move very little and hence have little participation in the transduction of signals by the device. One approach to eliminating this disparity has been to use a small membrane electrode 20 which does not extend to the supports 16. This restricts the charge on the membrane electrode to the center of the device where it will participate strongly in the motion of the membrane and hence the transduction by the device. There still must be one or more electrical conductors to apply the bias voltage $V_B$ to the membrane electrode 20 and to couple the a.c. signals to and from the electrode. These electrical conductors are necessarily very thin, with dimensions that impose undesirably large impedances on the a.c. signals, thereby limiting the sensitivity of the device.

Since CMUTs and other MUTs are manufactured with semiconductor processes they are necessarily small in size compared to conventional ceramic PZT transducer elements. As previously mentioned, the surface dimensions of MUTs are measured in microns. The small size is advantageous when a compact transducer array is required, such as for ultrasonic intravascular catheters and cardiac transducer probes which scan between the ribs. However there are other applications such as abdominal applications where larger apertures and greater penetration is desired. In these applications larger size arrays are preferable. One way to construct a larger aperture array with CMUTs is to interconnect, or tile, a number of CMUT assemblies together side-by-side to form one large array. While it may be possible to form the entire assembly on a single substrate, there is an increasing possibility of the occurrence of fabrication defects with arrays of increasing size. To avoid such yield problems it is preferable to fabricate smaller subassemblies which can be inspected, then form the entire assembly from a number of defect-free subassemblies. Each subassembly or tile is comprised of a one or two dimensional array of CMUTs fabricated on one substrate. The individual substrate tiles are then aligned side by side to form a large array. In aligning multiple array subassemblies it is desirable to maintain the pitch, or spacing, of the elements across the entire assembly, rather than have gaps at the edges where one substrate abuts another. This enables the aperture to be uniformly transitioned across the surface of the entire assembly as is done when stepping or tractor-treading the aperture of a linear array transducer across the assembly. A uniform pitch will avoid the generation of artifacts and undesired sidelobes when a gap at the edges of a tile would otherwise move into the active transition aperture.

SUMMARY OF THE INVENTION

It is an object of the present invention to provide a CMUT transducer array for an ultrasound probe which can be fabricated with semiconductor processes that are compatible with those of the integrated circuitry used to operate the array such as a CMOS process.

It is a further object of the present invention to provide a large aperture CMUT transducer array which can be assembled from multiple subassemblies or tiles of CMUTs.

It is a further object of the present invention to provide a large aperture array of CMUT tiles which maintains the pitch of the CMUT cells across the array.

In accordance with the principles of the present invention, an ultrasonic transducer CMUT cell array transducer is provided which is formed of multiple tiles of CMUT cells. Each tile comprises a one or two dimensional array of CMUT cells on a substrate with a predetermined pitch across the row and, for a two dimensional array, also in the column direction. Edges of the tiles are shaped so that individual tiles can be assembled adjacent to each other while maintaining a desired cell pitch from one tile to another. Preferably the edges are shaped by an etching process instead of the conventional dicing process such as a deep reactive ion etching process. With etching, nonlinear edges can be formed such as meandering edges that track closely to each CMUT cell from one row to the next. Etching enables the formation of straight sides to the substrate close to the CMUT cells without the hazard of chipping and cracking which can occur with a dicing process. In a preferred embodiment the tiles also contain electrical contacts formed on the top (CMUT) surface of the substrate. These contacts are electrically coupled to the CMUT cells of the tile to power, drive and receive signals from the cells or aggregates of cells. The contacts enable an interconnect such as flex circuit to be coupled to a tile so that control circuitry such as microbeamformer circuitry can be coupled to the array of CMUTs.

BRIEF DESCRIPTION OF THE DRAWINGS

In the drawings:

FIG. 7a) through FIG. 7d) illustrate the etching of a CMUT array tile edge in accordance with the principles of the present invention and using a passivation layer.

DETAILED DESCRIPTION OF THE EMBODIMENTS

Figure 3:
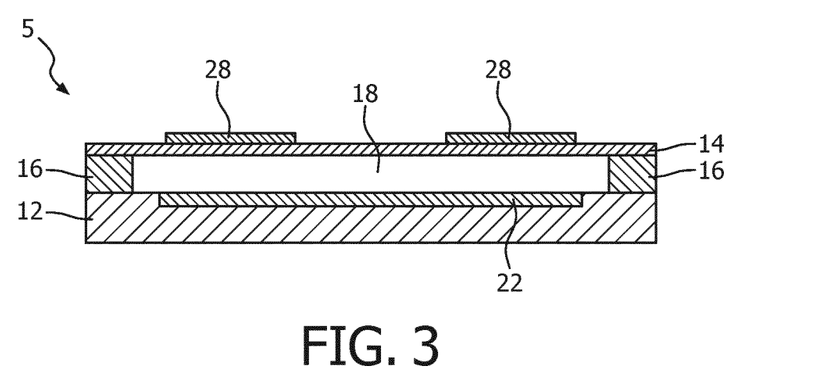
FIG. 3 is a cross-sectional view of a CMUT cell constructed in accordance with the principles of the present invention.
Figure 6:
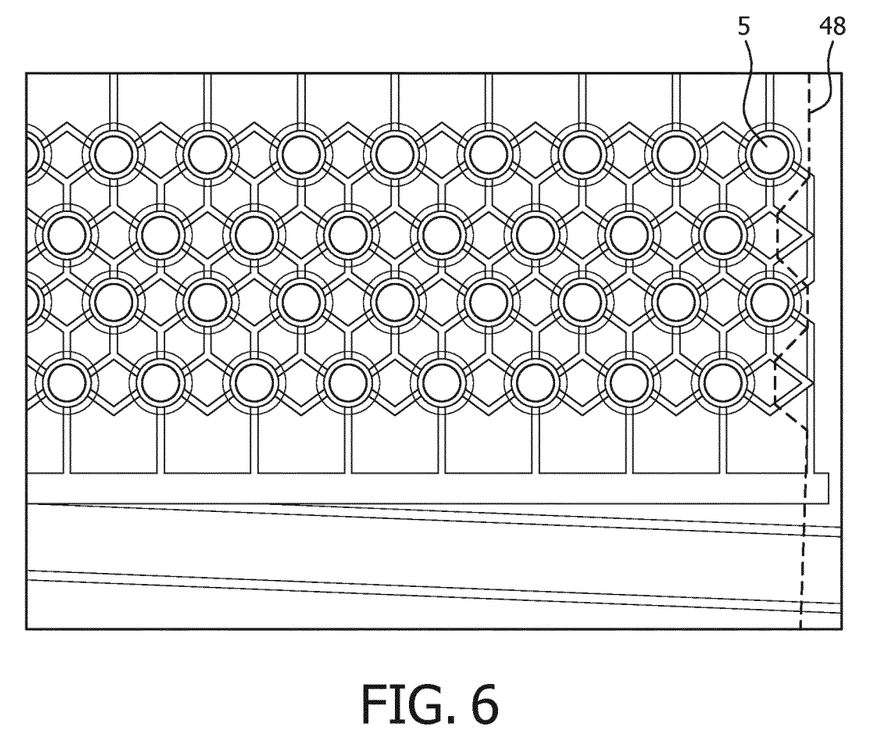
FIG. 6 is an interferometric image of an array of circular CMUT cells with a dashed line showing a meandering etching path for an edge which will align with a complementary etched tile and preserve the CMUT cell pitch from one tile to the next.

With reference to FIG. 3, a schematic cross-section of a CMUT element or cell 5 is depicted. CMUT cell 5 includes a substrate layer 12, an electrode 22, a membrane layer 14, and a membrane electrode ring 28, the circular form of which is seen in FIG. 6. In this example, the electrode 22 is circularly configured and embedded in the substrate layer 12. In addition, the membrane layer 14 is fixed relative to the top face of the substrate layer 12 and configured/dimensioned so as to define a spherical or cylindrical cavity 18 between the membrane layer 14 and the substrate layer 12. As previously mentioned, the cell and its cavity 18 may define alternative geometries. For example, cavity 18 could define a rectangular and/or square cross-section, a hexagonal cross-section, an elliptical cross-section, or an irregular cross-section.

The bottom electrode 22 is typically insulated on its cavity-facing surface with an additional layer (not pictured). A preferred insulating layer is an oxide-nitride-oxide (ONO) dielectric layer formed above the substrate electrode and below the membrane electrode. The ONO-dielectric layer advantageously reduced charge accumulation on the electrodes which leads to device instability and drift and reduction in acoustic output pressure. The fabrication of ONO-dielectric layers on a CMUT is discussed in detail in European patent application no. 08305553.3 by Klootwijk et al., filed Sep. 16, 2008 and entitled "Capacitive micromachined ultrasound transducer." Use of the ONO-dielectric layer is desirable with precollpased CMUT, which are more susceptible to charge retention than are uncollapsed device. The disclosed components may be fabricated from CMOS compatible materials, e.g., Al, Ti, nitrides (e.g., silicon nitride), oxides (various grades), tetra ethyl oxysilane (TEOS), poly-silicon and the like. In a CMOS fab, for example, the oxide and nitride layers may be formed by chemical vapor deposition and the metallization (electrode) layer put down by a sputtering process. Suitable CMOS processes are LPCVD and PECVD, the latter having a relatively low operating temperature of less than 400° C.

Exemplary techniques for producing the disclosed cavity 18 involve defining the cavity in an initial portion of the membrane layer 14 before adding a top face of the membrane layer 14. Other fabrication details may be found in U.S. Pat. No. 6,328,697 (Fraser). In the exemplary embodiment depicted in FIG. 3, the diameter of the cylindrical cavity 18 is larger than the diameter of the circularly configured electrode plate 22. Electrode ring 28 may have the same outer diameter as the circularly configured electrode plate 22, although such conformance is not required. Thus, in an exemplary embodiment of the present invention, the electrode ring 28 is fixed relative to the top face of the membrane layer 14 so as to align with the electrode plate 22 below.

Figure 4:
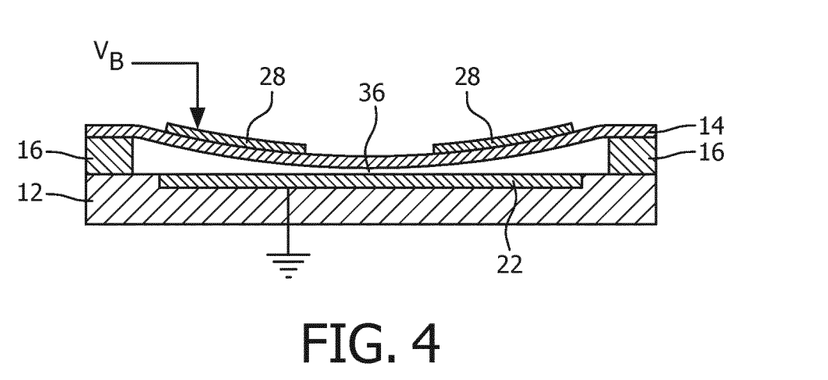
FIG. 4 illustrates the CMUT cell of FIG. 3 when biased into a collapsed state.
Figure 5:
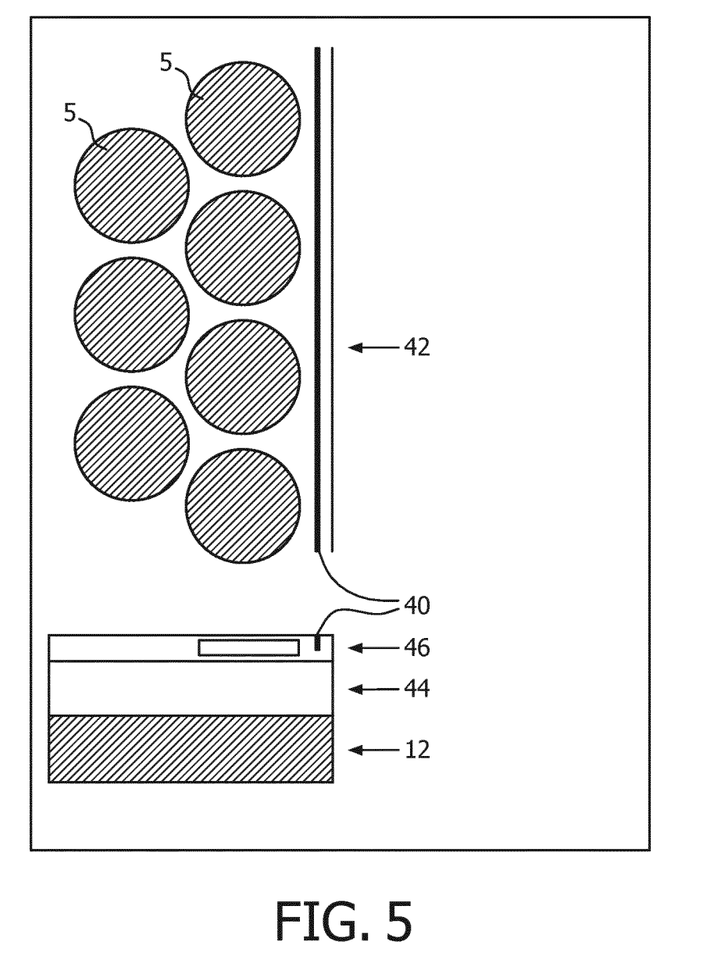
FIG. 5 illustrates the conventional approach to dicing CMUT cell tiles and employing a crack-stop gap.

FIG. 4 shows the CMUT cell of FIG. 5 when biased to a precollapsed state, in which the membrane 14 is in contact with the floor of the cavity 18. This is accomplished by applying a DC bias voltage to the two electrodes as indicated by voltage $V_B$ applied to the electrode ring 28 and a reference potential (ground) applied to the substrate electrode 22. While the electrode ring 28 could also be formed as a continuous disk without the hole in the center, FIG. 4 illustrates why this is not necessary. When the membrane 14 is biased to its precollapsed state as shown in this drawing, the center of the membrane is in contact with the floor of the cavity 18. As such, the center of the membrane 14 does not move during operation of the CMUT. Rather, it is the peripheral area of the membrane 14 which moves, that which is above the remaining open void of the cavity 18 and below the ring electrode. By forming the membrane electrode 28 as a ring, the charge of the upper plate of the capacitance of the device is located above the area of the CMUT which exhibits the motion and capacitive variation when the CMUT is operating as a transducer. Thus, the coupling coefficient of the CMUT transducer is improved.

The membrane 14 may be brought to its precollapsed state in contact with the floor of the cavity 18 as indicated at 36 by applying the necessary bias voltage, which is typically in the range of 50-100 volts. As the voltage is increased, the capacitance of the CMUT cell is monitored with a capacitance meter. A sudden change in the capacitance indicates that the membrane has collapsed to the floor of the cavity. The membrane can be biased downward until it just touches the floor of the cavity as indicated at 36, or can be biased further downward to increased collapse beyond that of minimal contact.

Another way to bring the membrane 14 to its precollapsed state is to apply pressure to the top of the membrane. When the cavity is formed in a partial or complete vacuum, it has been found that the application of atmospheric pressure of 1 Bar is sufficient to precollapse the membrane 14 to contact with the floor of the cavity 18. It is also possible to use a combination of pressure differential and bias voltage to controllably precollapse the membrane 14, which is effective with smaller devices that may have a high atmospheric collapse pressure (e.g., 10 Bar.) Yet another technique for biasing the membrane 14 to its precollapsed state is to place or form a structure above the membrane which physically retains the membrane in its precollapsed state. In a preferred embodiment for an ultrasound transducer, the structure forms the lens of the transducer.

Semiconductor parts are typically fabricated in large quantities on a wafer. After fabrication the individual parts must be separated, or singulated, so they can be used individually in different devices and products. The typical process of singulating parts from the wafer uses dicing. During the dicing process a certain level of chipping is expected. To minimize propagation of dicing-initiated cracks, a "crack stop" groove 40 is typically used as shown in FIG. 5. The shallow crack stop groove 40 is formed just inside the intended edge of the part after dicing as shown in the drawing. The groove 40 serves to stop the propagation of cracks toward the CMUT cells 5 during the dicing process, and there are acceptable distance requirements from the crack stop groove to nearby active devices and the die edge. This results in a significant distance, often comparable to the distance between individual devices, of the die edge from the active devices (CMUTs), which is undesirable for tiling and maintaining pitch continuity from tile to tile. A typical size (diameter) of a cMUT cell can vary from 30 micrometer up to 300 micrometer or even larger. The size of the selected CMUT cell would depend on a desired operational frequency of a given transducer. In general a density of the CMUT cell devices in the array would be maximized by keeping an average distance between individual device below 5 to 10 micrometer or even below 3 micrometer. In addition to the top plan view of the tile edge shown at the top of FIG. 5, a side view of the die is shown at the bottom of the drawing, including the substrate 12, an ASIC layer containing microbeamformer circuitry, and a top CMUT layer.

To solve this problem in accordance with the principles of the present invention, an etch singulation is used. Since there is no chipping with an etch process, there is no need for a crack stop groove, nor the required distances from a crack stop groove to the active devices and etched edge. A further consequence of this process is that the etched die edge can be very close to the cMUT cells (generally at half distance between individual devices 5), enabling the maintenance of a constant (continuous) pitch from one die to the next. FIG. 6 is a top plan image of an array of CMUTs with a dashed line 48 indicating a meandering etching path for an edge which wraps closely to CMUT cells 5 (basically following the shape of the cMUT cells). The adjacent tile is formed with a complementary etched meandering path so that the two tiles will fit together with a constant pitch in the rows of cells from one tile to the next.

Figure 7:
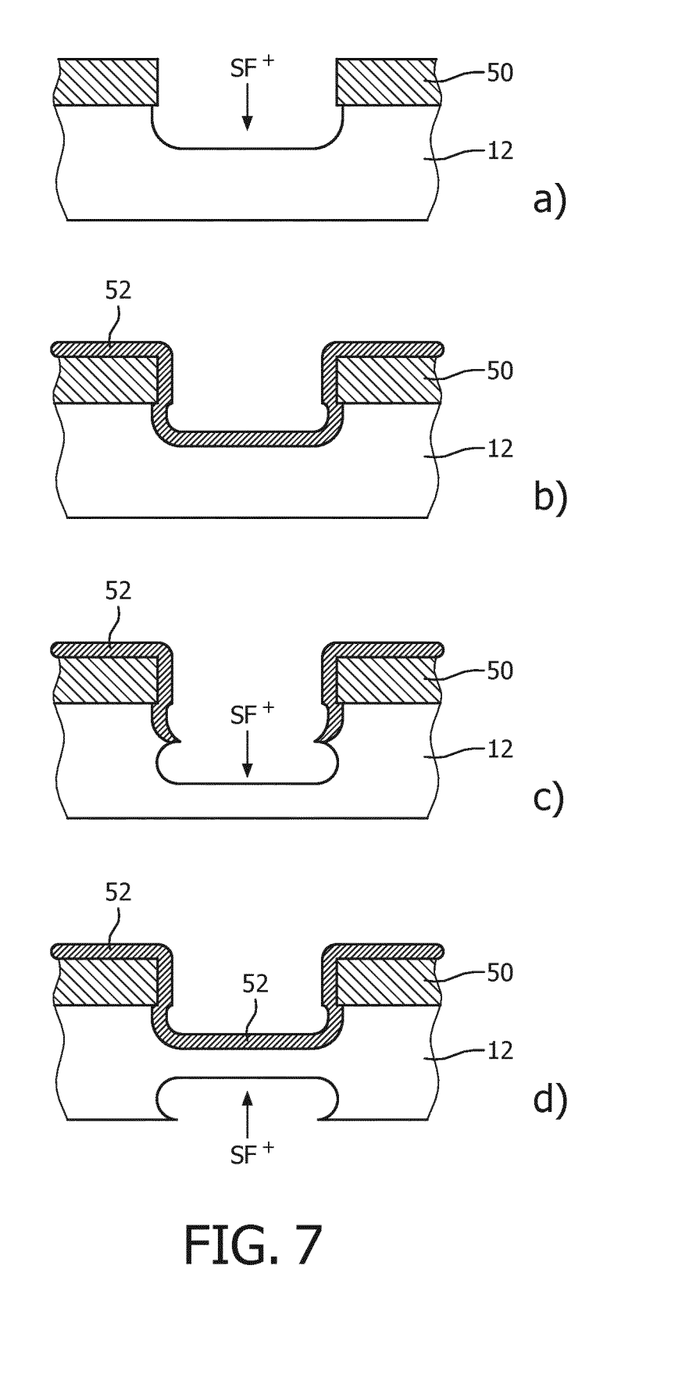

Since the etching must extend vertically from the top of the die completely through to the bottom of the substrate, it is preferable to use a deep reactive ion etching process which can form a highly vertical edge in a controlled manner over an extended depth. One technique for doing so is shown in FIGS. 7a) through 7d). In this example an optional mask 50 is located above the die as shown in FIG. 7a) and a highly anisotropic plasma (sulfur fluoride) flow is directed through an opening in the mask and the ion flow begins to etch through the die and its substrate 12. After the plasma has partially etched into the die, a passivation layer 52 is deposited over the trench as shown in FIG. 7b). The passivation layer may be an appropriate polymer such as polyimide or a benzocyclobutene-based polymer (BCB). The passivation layer protects the walls of the trench from further exposure to the chemical etchant. The anisotropic etchant will attack the passivation layer at the bottom of the trench, sputter it off, and the trench can then be etched to a deeper depth as shown in FIG. 7c). Alternatively, after the trench has been partially formed from the top (FIG. 7b)), the wafer is turned over and a trench is etched from the backside of the die as shown in FIG. 7d), stopping at the polymer 52. Finally the polymer is sputtered off by means of etching. Yet another alternative after the trench has been partially formed from the top is to thin the wafer from the backside (bottom) by means of grinding until the partially formed trench is reached.

Figure 8:
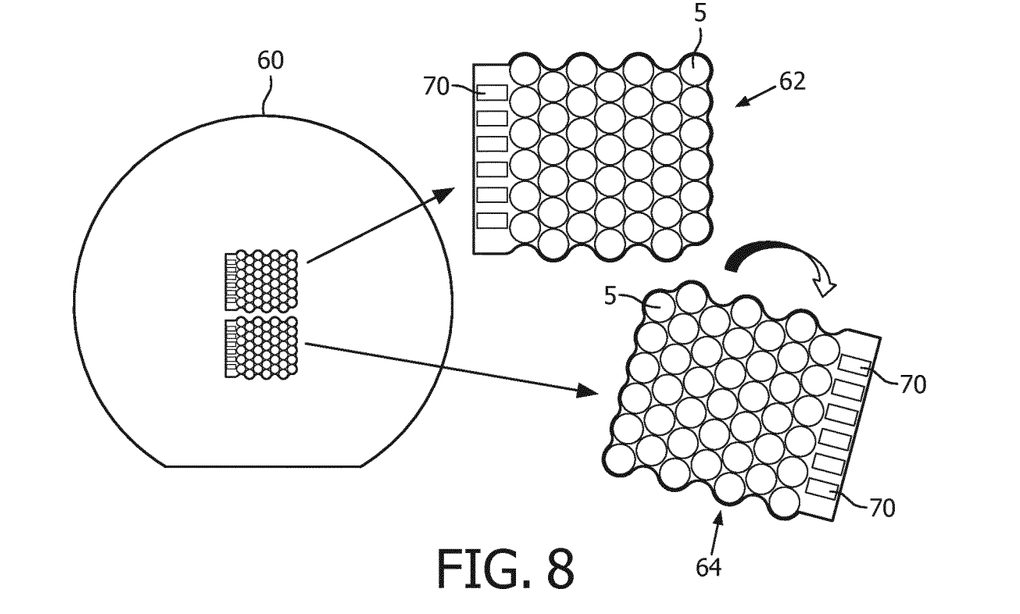
FIG. 8 illustrates two CMUT array tiles with pitch-maintaining edges and surface electrical contacts for electrical interconnects.
Figure 9:
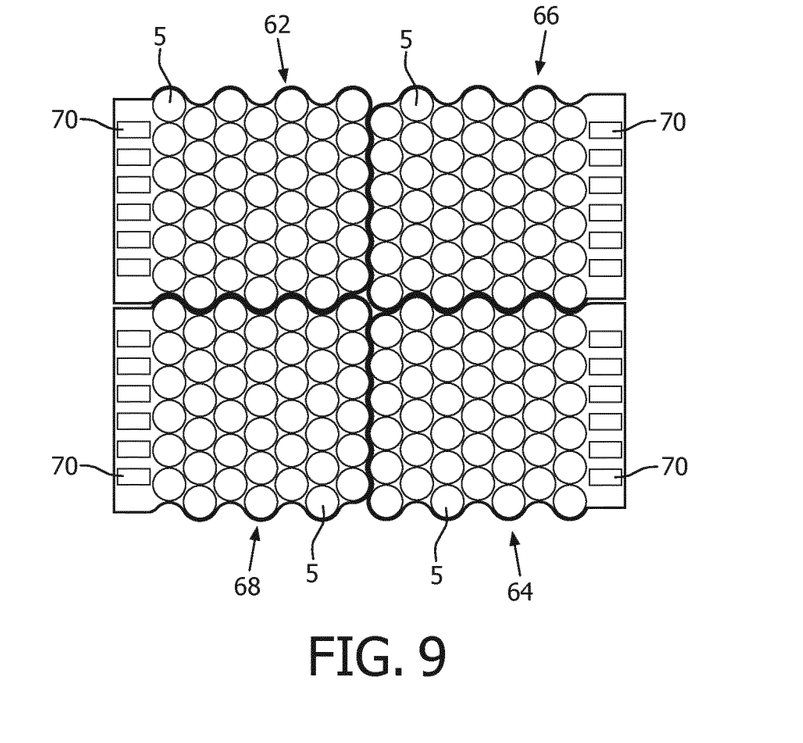
FIG. 9 illustrates a large aperture CMUT array assembly using four of the tiles with electrical contacts of FIG. 8.

FIG. 8 illustrates a wafer 60 from which two CMUT tiles 62 and 64 are singulated by etching in accordance with the present invention. In this example interconnect electrodes 70 are formed on the top surface of each die along an edge of each die. Since the etching process can be controlled to form an edge of virtually any shape or contour, the edges can closely follow the shapes of the CMUT cells 5 as in this example. This enables the tiles to be fitted together in different orientations, such as with the interconnect electrodes on the same side as shown over the wafer 60 or with the tiles turned in alternation with the interconnect electrodes on opposite sides as shown at the right of the drawing. Alternation permits interconnects such as flex circuit to access and attach to the electrodes 70 on multiple sides of the assembled CMUT array. This is shown in the completed CMUT array assembly of FIG. 9, in which four tiles 62, 64, 66 and 68 are fitted together to form a large aperture CMUT array with the pitch of the CMUT cells maintained uniformly across the array.

Figure 10:
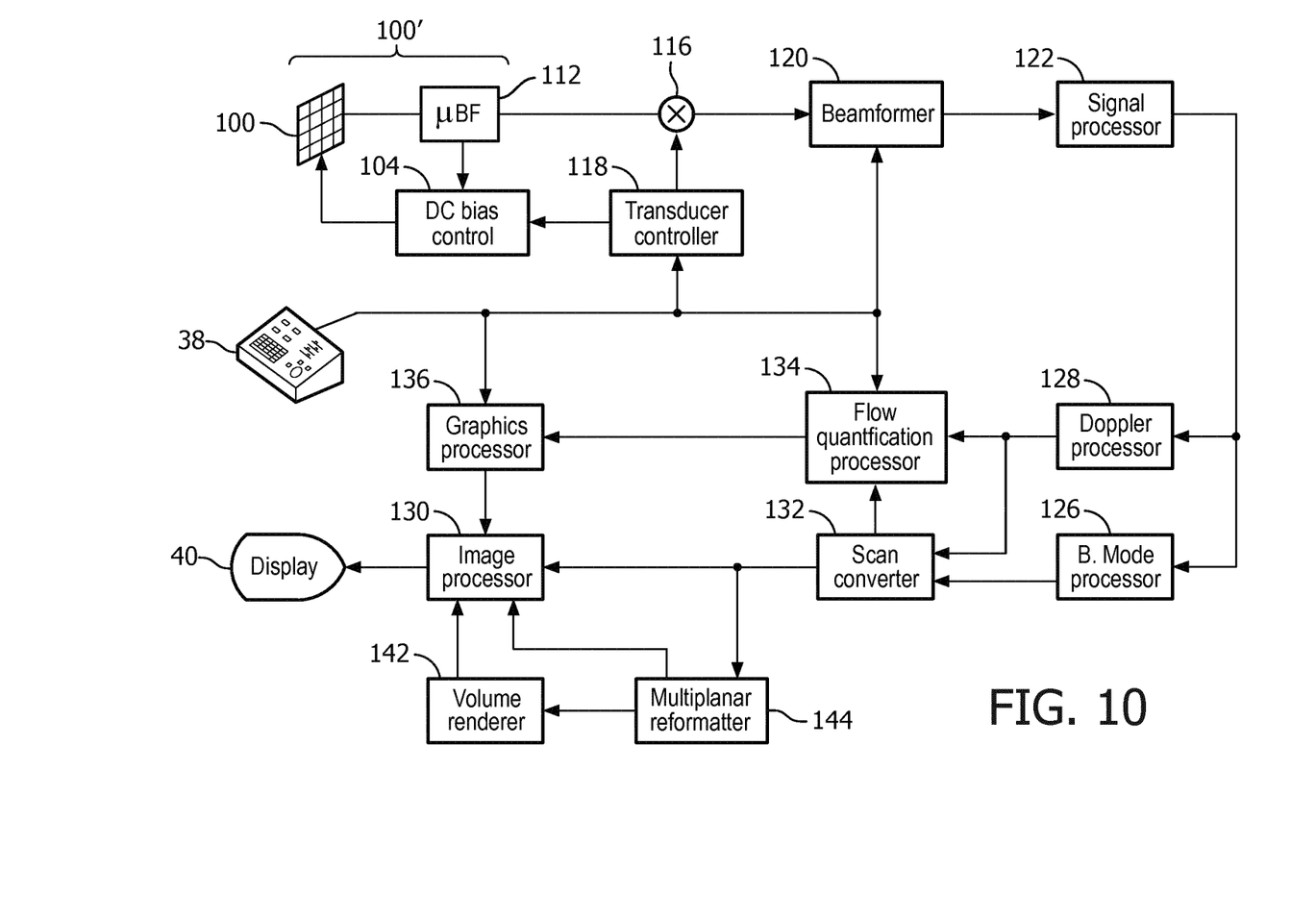
FIG. 10 illustrates in block diagram form an ultrasonic diagnostic imaging system with a tiled large aperture CMUT array transducer probe constructed in accordance with the principles of the present invention.

FIG. 10 illustrates in block diagram form an ultrasonic diagnostic imaging system with a tiled large aperture CMUT array transducer probe 100' constructed in accordance with the principles of the present invention. The large aperture array 100 is formed of sixteen tiles in this example. The transducer array 100' is a one- or a two-dimensional array of transducer elements capable of scanning in a 2D plane or in three dimensions for 3D imaging. The transducer array is coupled to a microbeamformer 112 in the probe which controls transmission and reception of signals by the CMUT array cells. Microbeamformers are capable of at least partial beamforming of the signals received by groups or "patches" of transducer elements as described in U.S. Pat. No. 5,997, 479 (Savord et al.), U.S. Pat. No. 6,013,032 (Savord), and U.S. Pat. No. 6,623,432 (Powers et al.) The microbeamformer is coupled by the probe cable to a transmit/receive (T/R) switch 116 which switches between transmission and reception and protects the main system beamformer 120 from high energy transmit signals when a microbeamformer is not used and the transducer array is operated directly by the main system beamformer. The transmission of ultrasonic beams from the CMUT transducer array 100 under control of the microbeamformer 112 is directed by a transducer controller 118 coupled to the T/R switch and the main system beamformer 120, which receives input from the user's operation of the user interface or control panel 38. One of the functions controlled by the transducer controller is the direction in which beams are steered. Beams may be steered straight ahead from (orthogonal to) the transducer array, or at different angles for a wider field of view. The transducer controller 118 also controls the DC bias applied to the CMUT cells which biases the cell membranes 14 to a precollapsed state.

The partially beamformed signals produced by the microbeamformer 112 on receive are coupled to a main beamformer 120 where partially beamformed signals from individual patches of transducer elements are combined into a fully beamformed signal. For example, the main beamformer 120 may have 128 channels, each of which receives a partially beamformed signal from a patch of dozens or hundreds of CMUT transducer cells. In this way the signals received by thousands of transducer elements of a CMUT transducer array can contribute efficiently to a single beamformed signal.

The beamformed signals are coupled to a signal processor 122. The signal processor 122 can process the received echo signals in various ways, such as bandpass filtering, decimation, I and Q component separation, and harmonic signal separation which acts to separate linear and nonlinear signals so as to enable the identification of nonlinear echo signals returned from tissue and microbubbles. The signal processor may also perform additional signal enhancement such as speckle reduction, signal compounding, and noise elimination. The bandpass filter in the signal processor can be a tracking filter as described above, with its passband sliding from a higher frequency band to a lower frequency band as echo signals are received from increasing depths, thereby rejecting the noise at higher frequencies from greater depths where these frequencies are devoid of anatomical information.

The processed signals are coupled to a B mode processor 126 and a Doppler processor 128. The B mode processor 126 employs amplitude detection for the imaging of structures in the body such as the tissue of organs and vessels in the body. B mode images of structure of the body may be formed in either the harmonic mode or the fundamental mode or a combination of both as described in U.S. Pat. No. 6,283,919 (Roundhill et al.) and U.S. Pat. No. 6,458,083 (Jago et al.) The Doppler processor 128 processes temporally distinct signals from tissue movement and blood flow for the detection of the motion of substances such as the flow of blood cells in the image field. The Doppler processor typically includes a wall filter with parameters which may be set to pass and/or reject echoes returned from selected types of materials in the body. For instance, the wall filter can be set to have a passband characteristic which passes signal of relatively low amplitude from higher velocity materials while rejecting relatively strong signals from lower or zero velocity material. This passband characteristic will pass signals from flowing blood while rejecting signals from nearby stationary or slowing moving objects such as the wall of the heart. An inverse characteristic would pass signals from moving tissue of the heart while rejecting blood flow signals for what is referred to as tissue Doppler imaging, detecting and depicting the motion of tissue. The Doppler processor receives and processes a sequence of temporally discrete echo signals from different points in an image field, the sequence of echoes from a particular point referred to as an ensemble. An ensemble of echoes received in rapid succession over a relatively short interval can be used to estimate the Doppler shift frequency of flowing blood, with the correspondence of the Doppler frequency to velocity indicating the blood flow velocity. An ensemble of echoes received over a longer period of time is used to estimate the velocity of slower flowing blood or slowly moving tissue.

The structural and motion signals produced by the B mode and Doppler processors are coupled to a scan converter 132 and a multiplanar reformatter 144. The scan converter arranges the echo signals in the spatial relationship from which they were received in a desired image format. For instance, the scan converter may arrange the echo signal into a two dimensional (2D) sector-shaped format, or a pyramidal three dimensional (3D) image. The scan converter can overlay a B mode structural image with colors corresponding to motion at points in the image field corresponding with their Doppler-estimated velocities to produce a color Doppler image which depicts the motion of tissue and blood flow in the image field. The multiplanar reformatter will convert echoes which are received from points in a common plane in a volumetric region of the body into an ultrasonic image of that plane, as described in U.S. Pat. No. 6,443,896 (Detmer). A volume renderer 142 converts the echo signals of a 3D data set into a projected 3D image as viewed from a given reference point as described in U.S. Pat. No. 6,530,885 (Entrekin et al.) The 2D or 3D images are coupled from the scan converter 32, multiplanar reformatter 44, and volume renderer 142 to an image processor 130 for further enhancement, buffering and temporary storage for display on an image display 40. In addition to being used for imaging, the blood flow velocity values produced by the Doppler processor 128 are coupled to a flow quantification processor 134. The flow quantification processor produces measure of different flow conditions such as the volume rate of blood flow. The flow quantification processor may receive input from the user control panel 38, such as the point in the anatomy of an image where a measurement is to be made. Output data from the flow quantification processor is coupled to a graphics processor 136 for the reproduction of measurement values with the image on the display 40. The graphics processor 136 can also generate graphic overlays for display with the ultrasound images. These graphic overlays can contain standard identifying information such as patient name, date and time of the image, imaging parameters, and the like. For these purposes the graphics processor receives input from the user interface 38, such as a typed patient name. The user interface is also coupled to the transmit controller 18 to control the generation of ultrasound signals from the transducer array 100 and hence the images produced by the transducer array and the ultrasound system. The user interface is also coupled to the multiplanar reformatter 144 for selection and control of a display of multiple multiplanar reformatted (MPR) images which may be used to perform quantified measures in the image field of the MPR images.

The invention claimed is:

1. A CMUT transducer array comprising:
a plurality of separate CMUT tiles aligned and in side by side engagement along an adjoining edge of each CMUT tile to form the CMUT array, wherein each CMUT tile comprises:
a substrate;
a plurality of CMUT cells located on the substrate and arranged in one or more rows, columns, or both; and
the adjoining edge formed at a side of the tile by an etching process which etches through the substrate in lateral proximity to one or more CMUT cells adjacent to the adjoining edge such that the one or more CMUT cells are positioned in a constant pitch with one or more CMUT cells of an abutting CMUT tile along the adjoining edge,
wherein the adjoining edge comprises a curved edge.

2. The CMUT transducer array of claim 1, wherein the adjoining edge is a nonlinear etched edge in lateral proximity to a plurality of CMUT cells.

3. The CMUT transducer array of claim 2, wherein the plurality of separate CMUT tiles exhibit symmetry such that a nonlinear adjoining edge of a first CMUT tile can be positioned adjacent to either of two adjoining edges of a second CMUT tile while retaining a constant CMUT cell pitch from the first CMUT tile to the second CMUT tile.

4. The CMUT transducer array of claim 2, wherein the nonlinear etched edge comprises a series of linear, differently directed edge segments.

5. The CMUT transducer array of claim 2, wherein the nonlinear etched edge comprises a continuously arcuate contoured etched edge.

6. The CMUT transducer array of claim 2, wherein the nonlinear etched edge follows a contour of at least one CMUT transducer of the CMUT transducer array.

7. The CMUT transducer array of claim 1, wherein the adjoining edge is etched by an anisotropic etch process.

8. The CMUT transducer array of claim 7, wherein the anisotropic etch process further comprises a deep reactive ion etching process.

9. The CMUT transducer array of claim 1, wherein each CMUT tile further comprises a plurality of interconnect electrodes located on the substrate along the adjoining edge and electrically coupled to CMUT cells of the CMUT tile.

10. The CMUT transducer array of claim 9,
wherein the plurality of separate CMUT tiles exhibit symmetry such that a first etched adjoining edge of a first CMUT tile can be located adjacent to a second etched adjoining edge of a second tile while retaining a constant CMUT cell pitch from the first CMUT tile to the second CMUT tile,
wherein the first CMUT tile has a plurality of interconnect electrodes located along an edge opposite the first etched adjoining edge, and
wherein the second CMUT tile has a plurality of interconnect electrodes located along an edge opposite the second etched adjoining edge.

11. The CMUT transducer array of claim 1, wherein the adjoining edge is formed by alternately etching from the top and bottom of the substrate.

12. The CMUT transducer array of claim 1, wherein the adjoining edge is at least partially coated with a polymer.

13. The CMUT transducer array of claim 12, wherein the polymer includes at least one of a polyimide or a benzocyclobutene-based polymer.

14. The CMUT transducer array of claim 1, wherein the adjoining edge is formed by alternately etching from the top of the substrate and grinding from the bottom of the substrate.

15. The CMUT transducer array of claim 1, wherein the CMUT cells are operated in a collapsed mode of operation.

16. The CMUT transducer array of claim 15, wherein the CMUT cells are maintained in the collapsed mode during operation by a bias voltage.

17. An ultrasound imaging system with a probe comprising the CMUT transducer array of claim 1.

18. The CMUT transducer array of claim 1, wherein the plurality of CMUT tiles includes at least two CMUT tiles.

19. The CMUT transducer array of claim 1, wherein the plurality of CMUT tiles includes at least four CMUT tiles.

* * * * *